United States Patent
Wüstenbecker

(10) Patent No.: US 8,173,925 B2
(45) Date of Patent: May 8, 2012

(54) CAPACITIVE OPERATING ELEMENT

(75) Inventor: Dirk Wüstenbecker, Braunfels (DE)

(73) Assignee: Continental Automotive GmbH, Hannover (DE)

( * ) Notice: Subject to any disclaimer, the term of this patent is extended or adjusted under 35 U.S.C. 154(b) by 322 days.

(21) Appl. No.: 12/309,774

(22) PCT Filed: Aug. 1, 2007

(86) PCT No.: PCT/EP2007/057934
§ 371 (c)(1),
(2), (4) Date: Nov. 10, 2009

(87) PCT Pub. No.: WO2008/015225
PCT Pub. Date: Feb. 7, 2008

(65) Prior Publication Data
US 2010/0059349 A1   Mar. 11, 2010

(30) Foreign Application Priority Data

Aug. 1, 2006 (DE) .......................... 10 2006 035 837

(51) Int. Cl.
*H03K 17/975* (2006.01)
(52) U.S. Cl. ........................................ 200/600; 361/291
(58) Field of Classification Search ................. 200/600; 361/291
See application file for complete search history.

(56) References Cited

U.S. PATENT DOCUMENTS

| 4,090,229 | A | | 5/1978 | Cencel et al. |
| 4,352,144 | A | | 9/1982 | McVey et al. |
| 4,584,444 | A | * | 4/1986 | Nagashima ................... 200/600 |
| 5,573,107 | A | * | 11/1996 | Nakano et al. ................. 200/314 |
| 5,892,652 | A | * | 4/1999 | Bony et al. ..................... 361/291 |
| 5,923,267 | A | * | 7/1999 | Beuk et al. .................... 340/5.54 |
| 7,273,991 | B2 | | 9/2007 | Korultay et al. |
| 2008/0169936 | A1 | | 7/2008 | Pickering et al. |

FOREIGN PATENT DOCUMENTS

| DE | 274206 A1 | 4/1978 |
| DE | 3709305 | 9/1988 |
| DE | 4109517 A1 | 9/1992 |
| DE | 202005002157 U1 | 4/2005 |
| DE | 102004044378 A1 | 3/2006 |
| EP | 0780865 A1 | 6/1997 |
| GB | 2091489 A | 7/1982 |
| WO | WO 2005008003 A1 | 1/2005 |
| WO | WO 2005017727 A1 | 2/2005 |

* cited by examiner

*Primary Examiner* — Vanessa Girardi
(74) *Attorney, Agent, or Firm* — Cozen O'Connor

(57) ABSTRACT

An operating element having an actuating element disposed on a linear moving carrier element. The actuating element has a plate-like touch panel that is made of an electrically non-conductive material, which cooperates with a switching element, and wherein an electrically conductive sensor element of a capacitative proximity sensor is disposed. The sensor element is disposed on or in the touch panel.

26 Claims, 4 Drawing Sheets

CAPACITIVE OPERATING ELEMENT

CROSS REFERENCE TO RELATED APPLICATION

This is a U.S. national stage of application No. PCT/EP2007/057934, filed on 1 Aug. 2007, priority is claimed on the following application German Application No.: 10 2006

BACKGROUND OF THE INVENTION

Field of the Invention

The invention relates to an operating element, particularly for a motor vehicle component, comprising an actuating element arranged on a linearly movable carrier element, the actuating element having a plate like touch plate which can be manually acted upon on its one plate side and which is made of an electrically nonconductive material, by means of which a switching element can be actuated and in which an electrically conductive sensor element of a capacitive proximity sensor is arranged which is electrically conductively connected to a circuit board.

To operate motor vehicle components such as, for example, a radio unit, a navigation unit, a car telephone, a multimedia system and the like, operating and display devices are frequently used which are ergonomically arranged in the vehicle. The display device should be arranged in such a manner that the driver can see it with the least possible distraction from the road traffic. The display unit is therefore preferably arranged in the area of the dashboard or in the upper area of a center console. The operating unit is preferably arranged in such a manner that the driver can reach it with his fingers without any great arm movement. However, this arrangement of the operating unit has the disadvantage that the operating unit cannot be easily seen visually. The driver will therefore frequently touch and select the operating elements of the operating unit without visual contact. It is therefore desirable to detect the approach of a hand of the driver to an operating element in order to be able to output, for example on the display device, an indication of the type of operating element or the function to be operated by it or also an audible return message before the operating element is actuated and the associated action is carried out. From DE 27 44 206 A1 and GB-A-2 091 489, capacitive touch switches are known.

SUMMARY OF THE INVENTION

It is an object of the invention to create an operating element of the type initially mentioned by means of which the approach of a hand to the operating element can be detected with a high degree of surety.

According to an embodiment of the invention, a element of a proximity sensor is arranged at or in the touch plate, wherein by means of the sensor element, an approach of a hand of an operating person can be detected and a sensor signal can be forwarded to signal-processing elements.

By means of this construction, a user's hand is generally guided very close to the sensor element of the proximity sensor independent of production tolerances of the components of the operating element so that the approaching hand is detected with great surety.

It is also possible to use different actuating elements, the operating elements otherwise being of the same type of construction, since the sensor element of the proximity sensor is always located at an optimal position.

In particular, the actuating elements preferably have different lengths.

In the actuating element of the operating element, an electrically conductive sensor element (sensor electrode) of a capacitive proximity sensor is arranged which is electrically conductively connected to a circuit board. By arranging the sensor element in the actuating element, the sensor element is not visible to the user and thus does not in any way impair the visual appearance of the operating element. By means of the corresponding electrically conductive connection of the sensor element to the circuit board, a sensor signal of the sensor element can be forwarded in a simple manner to signal-processing elements which, in particular, are arranged on the circuit board itself. By suitably arranging the sensor element in the actuating element and suitably connecting it to the circuit board, it is possible to achieve conventional functionality of the operating element, particularly of a pushbutton.

To avoid damage, the sensor element is arranged at the second plate side of the touch plate which is opposite to the one plate side.

The sensor element is preferably attached to the touch plate. It is particularly advantageous, however, if the sensor element is loaded by a spring resting against the second plate side of the touch plate which is opposite the one plate side.

As a dual function of the spring, the sensor element is preferably connected electrically conductively to the circuit board by means of the spring. In this arrangement, the spring is preferably a compression spring. In another embodiment, the spring is a helical compression spring.

If the spring is an accordion-like spring element which consists of two or more sheet metal parts forming folds with one another, actuating elements of great and different length can be used, the operating element otherwise having the same structure.

As a simple embodiment, the sensor element is a metal element or a metallically coated plastic element and can be constructed as sensor plate.

If the shape of the area of the sensor plate resting against the touch plate corresponds to the shape of the second plate side of the sensor plate, the entire sensor plate is arranged optimized close to the first plate side of the touch plate. This makes it possible to use also touch plates with a form deviating from a plane such as, e.g. a domed surface without losing the sensor sensitivity. A simple plug in assembly is made possible by the fact that the actuating element is constructed to be pot like and is placed with its pot opening onto the carrier element, the bottom of the pot forming the touch plate. In this arrangement, the actuating element can have different cross sections such as e.g. rectangular or round.

It is simple to manufacture if the carrier element is a frame-like sheet metal/bending part which can be moved from a normal position into a switch position against a spring force. In this arrangement, the pot-like actuating element in plug-in assembly can be plugged onto the carrier element and, in particular, can be held by fixing elements.

If the actuating element is held nonpositively on the carrier element, manufacturing tolerances can be compensated for by variable insertion depth. This is of advantageous, in the case of several preferably identical operating elements of a device.

The carrier element preferably has locking elements protruding transversely to a direction of movement which rest against the pot wall of the actuating element with elastic pretension.

The locking elements are notchings of the carrier element which are bent away transversely to the direction of movement, such that a considerable reduction of components and of assembly effort is obtained. The carrier element can be arranged at a cover which covers the circuit board so as to be movable from the normal position into the switch position against the spring force.

In this arrangement, the cover has an opening into which the actuating element arranged on the carrier element can be moved and, the opening simultaneously forms a guide for the operating element. In a preferred embodiment, the actuating element can be moved entirely through opening through the cover.

The spring force can have a maximum on the path of movement of the actuating element between the normal position and the switch position so that an actuation of the switching element takes place only after overcoming the maximum of the spring force and thus a complete moving of the actuating element into the switch position. Any unintentional actuation of the switching element is thus largely avoided.

To hold the unactuated actuating element in its normal position and to move it back into the normal position after actuation, the carrier element is preferably arranged over one or more spring arms at the cover or a component connected to the cover.

In a component and assembly expenditure reducing manner, the spring arms are constructed integrally with the carrier element as sheet metal/bending component.

As a dual function, the switching element can be actuatable in the switch position by means of the spring arms.

The conducting carrier element preferably has a contact tongue which is electrically conductively connected to a contact of the circuit board, wherein the contact tongue can be constructed as a sheet metal/bending component integrally with the carrier element.

Especially few components are required if spring, carrier element and contact tongue are constructed to be electrically conductive and form an electrically conductive connection of the sensor element to the circuit board.

This also leads to a small constructional size of the operating element.

Without requiring additional construction space, an illumination of the touch plate is possible if the components of the operating element have a continuous light opening at the end of which opposite to the touch plate a light source is arranged by means of which a transparent area of the touch plate can be backlit.

To provide good utilization of the light and uniform light distribution, the inner circumferential area of the carrier element preferably has a reflection coating.

An exemplary embodiment of the invention is shown in the drawing and will be described in greater detail in the text which follows.

Figure 1:
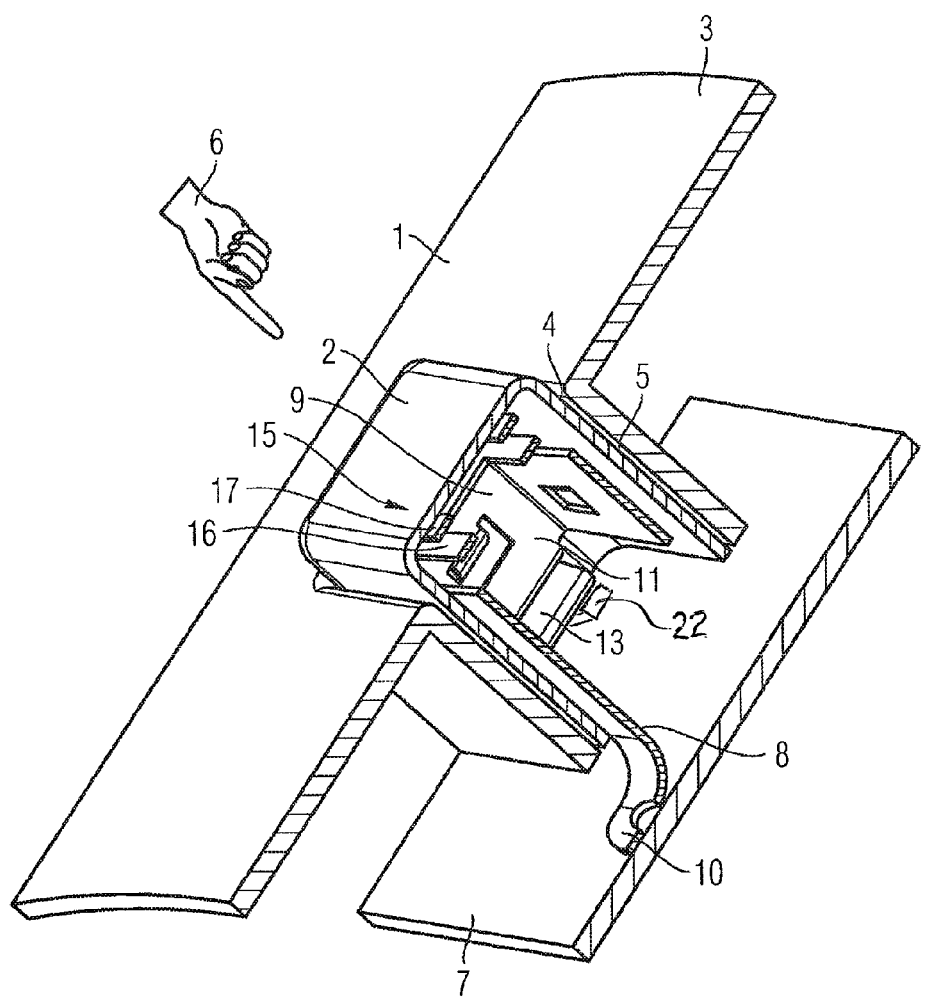
FIG. 1 is a perspective cross section through an operating element.

As shown in FIG. 1, a fixed cover 3, an opening 4 is formed from which comes a guide duct 5 to the side opposite to the actuating side. The actuating side is symbolically represented by an actuating hand 6. The guide duct 5 extends to a circuit board 7 arranged in a self-supported manner approximately in parallel with the cover 3.

A contact tongue 8, extending perpendicularly to the circuit board 7, of a carrier element 11 rests with its bent-away end 10 on a conductor track, not shown, of the circuit board 7 and is permanently connected to the circuit board 7.

The contact tongue 8, which forms a restoring spring is constructed integrally with a frame-like carrier element 11 constructed as sheet metal/bending part that protrudes into the guide duct 5. From the actuating side, a pot-like actuating element 1 is placed onto the carrier element 11, the bottom of which forms a touch plate 2, which is preferably acted upon by an operating person, and which protrudes into the guide duct 5 and is carried displaceably therein.

Figure 2:
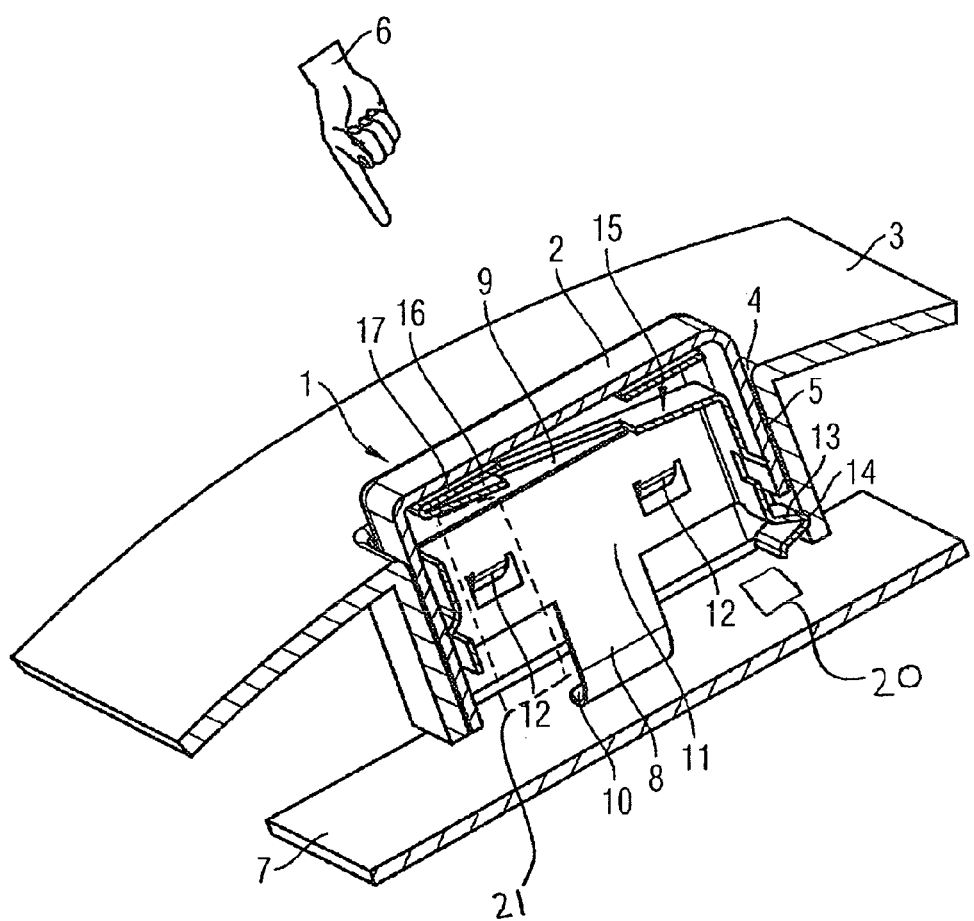
FIG. 2 is a perspective longitudinal section through the operating element according to FIG. 1.
Figure 3:
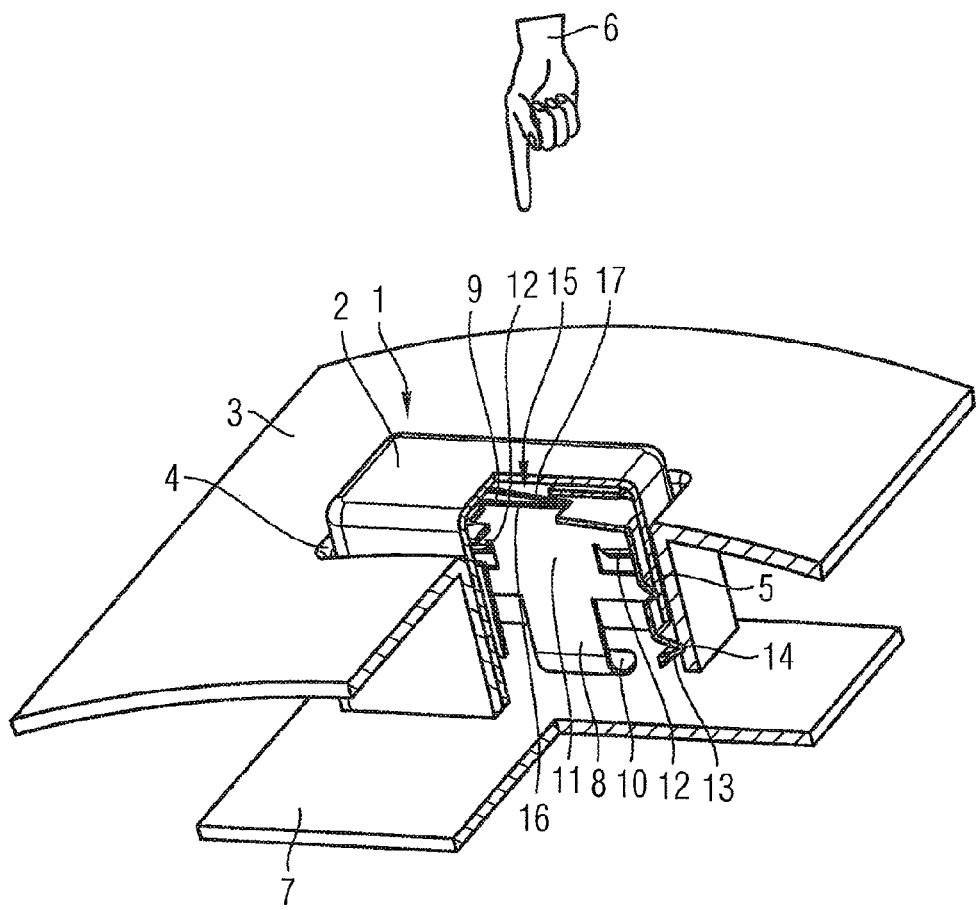
FIG. 3 is a perspective view of the operating element according to FIG. 1 in a partial section.
Figure 4:
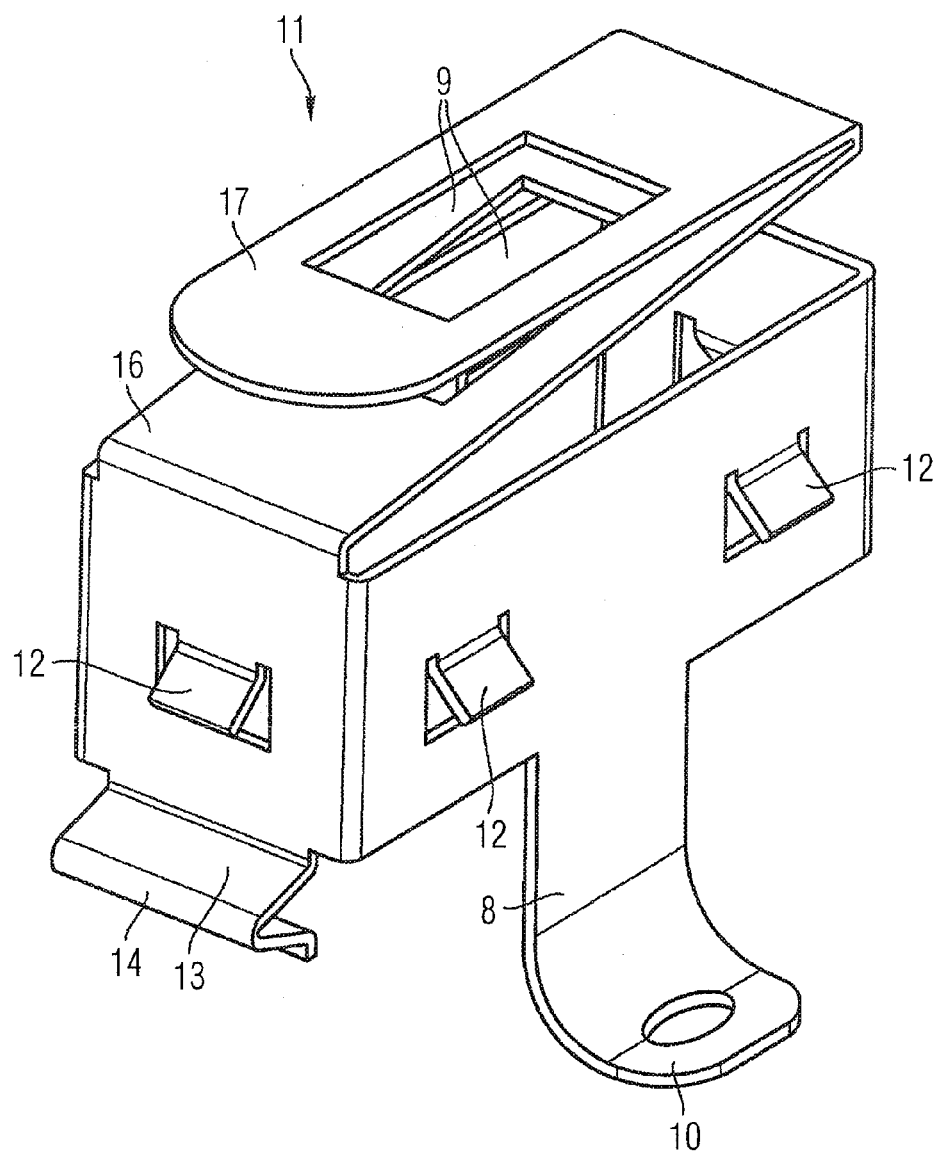
FIG. 4 is a perspective view of a carrier element of the operating element according to FIG. 1.

As shown in FIG. 2, mount the actuating element 1 on the carrier element 11, the carrier element 11 has notchings 12, bent away transversely to the direction of movement of the actuating element 1, at its frame sides which rest with elastic pretension against the inside walls of the actuating element 1 and thus form a nonpositive connection. In one embodiment, spring 21, shown as a dashed line, connects the sensor element to the circuit board by means of the spring. Spring 21 is configured to be a compression spring, a helical compression spring, or the like.

Since the notchings 12 are inclined towards the circuit board 7, the actuating element 1 can be pushed onto the carrier element 11 steplessly into the position desired in each case.

A spring arm 13, which preferably has a V-shaped bend 14, is aligned approximately in parallel with the circuit board 7, which bend rests with its V-point with pretension against one wall of the guide duct 5, is likewise constructed integrally with the carrier element 11 at its side which is directed towards the circuit board 7.

The free end of the spring arm 13, which is directed towards the circuit board 7, forms a contact which when the actuating element 1 is acted upon and the actuating element 1 and the carrier element 11 are displaced in the direction towards the circuit board 7 actuates a switching element 22 arranged on the circuit board 7.

At the end of the carrier element 11, which faces the touch plate 2, a spring constructed as an accordion-like spring element 15 is arranged integrally with the latter and consists of two plates 16 and 17 which are connected to one another in a V shape and of which the plate 16 closer to the circuit board 7 is connected with its end opposite to the connection to the other plate 17 to the frame of the carrier element 11.

The plate 17 forms a sensor plate of a capacitive proximity sensor.

By means of the spring force of the spring element 15, its plate 17 forming the sensor plate is always held flat against the touch plate 2.

The sensor plate is thus located in a nearest possible position to the actuating hand 6 acting upon the operating element and can already sense a subsequent actuation of the operating element at an early time before the actuating element 1 is touched by the actuating hand 6.

In the plates 16 and 17, light openings 9 are formed through which the wholly or partially translucent touch plate 2 can be backlit by means of a light source 20, which is arranged on the circuit board 7 and protrudes into the carrier element 11.

To provide good utilization of the light and uniform light distribution, an inner circumferential area of the carrier element 11 preferably has a reflection coating.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An operating element for a motor vehicle component, the operating element comprising:
  a circuit board;
  a linearly movable carrier element;
  an actuating element arranged on the carrier element configured to actuate a switching element arranged on the linearly movable carrier element, the actuating element comprising a plate like touch plate, wherein a first side of the touch plate is an electrically nonconductive material;
  an electrically conductive sensor element of a capacitive proximity sensor electrically coupled to the circuit board and arranged in the actuating element, the electrically conductive sensor element arranged one of on or in the touch plate, the sensor element configured to detect an approach of an activating member to the actuating element and output a sensor signal indicating the approach to a signal-processing element.

2. The operating element according to claim 1, further comprising a light source, wherein the touch plate comprises a transparent area components configured to be backlit by the light source.

3. The operating element according to claim 2, wherein an inner circumferential area of the carrier element has a reflection coating.

4. The operating element according to claim 1, wherein the actuating element is cup-shaped having a cup opening and is configured so that a wall surrounding the cup opening is substantially on the carrier element, a bottom of the cup forming the touch plate.

5. The operating element according to claim 4, wherein the cup-shaped actuating element is configured to plug onto the carrier element and be held thereon by fixing elements.

6. The operating element according to claim 5, wherein the actuating element is configured to be held on the carrier element.

7. The operating element according to claim 5, wherein the carrier element has locking elements protruding transversely to a direction of movement which rest against the cup wall of the actuating element with elastic pretension.

8. The operating element according to claim 7, wherein the locking elements are notches of the carrier element that are bent away transversely to the direction of movement.

9. The operating element according to claim 1, wherein the sensor element is biased toward the touch plate.

10. The operating element according to claim 9, wherein the sensor element is electrically coupled to the circuit board via the spring.

11. The operating element according to claim 10, wherein the sensor element is at least one of a metal element or a metallically coated plastic element.

12. The operating element according to claim 11, wherein the sensor element is configured as a sensor plate.

13. The operating element according to claim 12, wherein a shape of an area of the sensor plate resting against the touch plate corresponds to a shape of the second side of the touch plate.

14. The operating element according to claim 9, wherein the spring is a compression spring.

15. The operating element according to claim 14, wherein the spring is a helical compression spring.

16. The operating element according to claim 14, wherein the spring is an accordion like spring element.

17. The operating element according to claim 1, wherein the linearly moveable carrier element is a frame-like sheet metal bending part configured to move from a normal position into a switch position against a spring force.

18. The operating element according to claim 17, wherein the carrier element comprises a contact tongue electrically coupled to a contact of the circuit board.

19. The operating element according to claim 18, wherein the contact tongue is constructed as sheet metal bending component integrally with the carrier element.

20. The operating element according to claim 19, wherein the spring, the carrier element, and the contact tongue are electrically conductive and form an electrically conductive connection between the sensor element and the circuit board.

21. The operating element according to claim 17, wherein the carrier element is arranged at a cover and configured to be movable from a normal position into a switch position against the spring force.

22. The operating element according to claim 21, wherein the cover has an opening into which the actuating element is arranged.

23. The operating element according to claim 21, wherein the
  spring force has a maximum force on a path of movement of the actuating element between the normal position and the switch position.

24. The operating element according to claim 21, wherein the carrier element is arranged over at least one of one or more spring arms and a component connected to the cover.

25. The operating element according to claim 24, wherein the one or more spring arms are constructed integrally with the carrier element as sheet metal bending component.

26. The operating element according to claim 24, wherein the switching element is actuated in the switch position by the one or more spring arms.

* * * * *